United States Patent
Lee

(10) Patent No.: US 12,439,744 B2
(45) Date of Patent: Oct. 7, 2025

(54) SEMICONDUCTOR DEVICE WITH A BOND PAD AND A SANDWICH PASSIVATION LAYER AND MANUFACTURING METHOD THEREOF

(71) Applicant: ams-OSRAM AG, Premstaetten (AT)

(72) Inventor: Ching-Lun Lee, Eindhoven (NL)

(73) Assignee: ams-OSRAM AG, Premstaetten (AT)

( * ) Notice: Subject to any disclaimer, the term of this patent is extended or adjusted under 35 U.S.C. 154(b) by 582 days.

(21) Appl. No.: 17/788,147

(22) PCT Filed: Dec. 18, 2020

(86) PCT No.: PCT/EP2020/087337
§ 371 (c)(1),
(2) Date: Jun. 22, 2022

(87) PCT Pub. No.: WO2021/130141
PCT Pub. Date: Jul. 1, 2021

(65) Prior Publication Data
US 2023/0029075 A1    Jan. 26, 2023

Related U.S. Application Data

(60) Provisional application No. 62/952,990, filed on Dec. 23, 2019.

(51) Int. Cl.
*H01L 33/44* (2010.01)
*H01L 23/00* (2006.01)
(Continued)

(52) U.S. Cl.
CPC ......... *H10H 20/84* (2025.01); *H01L 23/3192* (2013.01); *H01L 23/564* (2013.01);
(Continued)

(58) Field of Classification Search
CPC ..... H01L 2224/05647; H01L 2924/013; H01L 2924/01013; H01L 2924/00014;
(Continued)

(56) References Cited

U.S. PATENT DOCUMENTS 6,365,521 B1   4/2002   Shubert
6,465,044 B1   10/2002  Jain
(Continued)

FOREIGN PATENT DOCUMENTS

JP    H4-38829 A  *  2/1992  ........... H01L 21/316
JP    H04 38829 A    2/1992
(Continued)

OTHER PUBLICATIONS

International Searching Authority, Written Opinion of the International Searching Authority, International application No. PCT/EP2020/087337, Mar. 22, 2021, all pages. (Year: 2021).*

(Continued)

*Primary Examiner* — Victoria K. Hall
(74) *Attorney, Agent, or Firm* — Viering, Jentschura & Partner mbB

(57) ABSTRACT

A method of forming a sandwich passivation layer (405) on a semiconductor device (400) comprising a bond pad (404) is provided. The method comprises forming a first layer (406) over a surface of the semiconductor device (400), removing a part of the first layer (406) to expose a surface of the bond pad (404), forming a second layer (407) over the first layer (406) and the surface of the bond pad (404), and forming a third layer (408) over the second layer (407), wherein the surface of the bond pad (404) is not in contact with the first layer (406) or third layer (408).

14 Claims, 7 Drawing Sheets

(51) Int. Cl.
| | |
|---|---|
| *H01L 23/31* | (2006.01) |
| *H01L 31/02* | (2006.01) |
| *H01L 31/0216* | (2014.01) |
| *H01L 31/18* | (2006.01) |
| *H01L 33/00* | (2010.01) |
| *H01L 33/62* | (2010.01) |
| *H10F 71/00* | (2025.01) |
| *H10F 77/00* | (2025.01) |
| *H10F 77/30* | (2025.01) |
| *H10H 20/01* | (2025.01) |
| *H10H 20/84* | (2025.01) |
| *H10H 20/857* | (2025.01) |

(52) U.S. Cl.
CPC ......... *H10F 71/129* (2025.01); *H10F 77/306* (2025.01); *H10F 77/933* (2025.01); *H10H 20/01* (2025.01); *H10H 20/857* (2025.01); *H01L 24/05* (2013.01); *H01L 2224/03009* (2013.01); *H01L 2224/0391* (2013.01); *H01L 2224/04042* (2013.01); *H01L 2224/05567* (2013.01); *H01L 2224/05624* (2013.01); *H01L 2224/05647* (2013.01); *H10H 20/034* (2025.01); *H10H 20/0364* (2025.01)

(58) Field of Classification Search
CPC ........... H01L 2924/01029; H01L 2224/05624; H10H 20/84; H10H 20/034; H10H 20/857; H10H 20/036; H10F 77/933; H10F 77/306; H10F 71/129
See application file for complete search history.

(56) References Cited

U.S. PATENT DOCUMENTS

| | | | | |
|---|---|---|---|---|
| 7,790,051 | B1* | 9/2010 | Carroll | B82B 3/0071 216/87 |
| 2007/0148805 | A1 | 6/2007 | Kim | |
| 2012/0248422 | A1* | 10/2012 | Mine | H10K 50/8445 438/46 |
| 2012/0292728 | A1* | 11/2012 | Tsai | H10F 39/8053 257/E31.127 |
| 2018/0342552 | A1* | 11/2018 | Ho | H10F 39/8057 |
| 2021/0118830 | A1* | 4/2021 | Huang | H01L 24/11 |

FOREIGN PATENT DOCUMENTS

| | | |
|---|---|---|
| JP | H10 270447 A | 10/1998 |
| JP | H11 163034 A | 6/1999 |
| JP | 2003 218110 A | 7/2003 |

OTHER PUBLICATIONS

International Searching Authority, International Search Report, International application No. PCT/EP2020/087337, Mar. 22, 2021, all pages. (Year: 2021).*
Machine translation, Harada, Japanese Pat. Pub. No. JPH0438829A, translation date: Dec. 28, 2024, Espacenet, all pages. (Year: 2024).*
International Search Report and Written Opinion issued in connection with PCT Patent Application No. PCT/EP2020/087337 dated Mar. 22, 2021.
EP Communication pursuant to Article 94(3) for parallel EP Application 20 828 749.0, dated Jul. 29, 2025, 8 pages (for informational purpose only).

* cited by examiner $2Al + 3Cu^{2+} \rightarrow 2Al^{3+} + 3Cu \quad Ea = 1.13 \text{ volt}$

SEMICONDUCTOR DEVICE WITH A BOND PAD AND A SANDWICH PASSIVATION LAYER AND MANUFACTURING METHOD THEREOF

RELATED APPLICATIONS

The present invention is a U.S. National Stage under 35 USC 371 patent application, claiming priority to Serial No. PCT/EP2020/087337, filed on Dec. 18, 2020, which claims priority from U.S. Provisional Application No. 62/952,990, filed on Dec. 23, 2019; the entireties of both are hereby incorporated herein by reference.

TECHNICAL FIELD OF THE DISCLOSURE

The disclosure relates to a method and device for reducing aluminium bond pad corrosion in semiconductor devices, particularly but not exclusively, to a method of forming a sandwich passivation layer on a semiconductor device comprising a bond pad and a semiconductor device comprising a bond pad; and a sandwich passivation layer.

BACKGROUND OF THE DISCLOSURE

The present disclosure relates to a method and device for reducing bond pad corrosion in semiconductor devices. Corrosion defects in aluminum or aluminum-copper (Al—Cu) interconnects and bond pads is a significant issue for back end of line (BEOL) semiconductor processing.

FIG. 1 illustrates an example of a semiconductor device 100 with a single bond pad 103 of the prior art. A top dielectric layer 102 is formed over a semiconductor substrate 101. A top metal layer is the formed on the top dielectric later and etched to form metal interconnects and bond pads 103. A passivation layer 104 is then formed over the top metal layer, including the bond pad 103.

The passivation layer 104 may be formed in a dual passivation process. First, a layer of silicon oxide 104a is formed, followed by a layer of silicon nitride 104b. Both layers can be deposited by chemical vapor deposition (CVD) or plasma enhanced chemical vapor deposition (PECVD). The passivation layer 104 is then etched to form an opening over the bond pad 103.

During back end of line (BEOL) semiconductor device 100 processing, a metal bond is formed on the bond pad 103 to attach the semiconductor device 100 to, for example, a wire, a contact, a device, or a circuit board. Any corrosion of the bond pad 103 can cause an effective barrier to high quality bonding. Corrosion of the bond pad 103 can cause the failure of the semiconductor device 100 due to poor metal bonds formed with the bond pad 103.

In the prior art, techniques for reducing corrosion of the surface of bond pads due to the presence of fluorine have been developed. These techniques include using plasma, deionized water comprising carbon dioxide or a combination of wet and dry etching processes.

It is an aim of the present disclosure to provide a method and device for reducing bond pad corrosion in semiconductor devices or at least provides a useful alternative.

SUMMARY

In an embodiment, this disclosure overcomes the above problems by providing a sandwich passivation layer for semiconductor devices. This arrangement reduces corrosion of a bond pad. In particular it reduces corrosion of the bond pad due to contamination on the surface of the semiconductor device. More particularly, this arrangement reduces corrosion due to chlorine (Cl—) or fluorine (F—) combination with O and OH elements trapped on tetraethyl orthosilicate (TEOS) based oxide films.

Both dry and wet etching processes, as well as the manufacturing environment, can cause contamination of the semiconductor device with molecules such as chlorine (Cl—) and fluorine (F—). If these molecules are in contact with moisture, such as OH—, they can form acids which can cause corrosion of the bond pads (see FIG. 2a).

Aluminum metallization films with copper additions used for the bond pads can exhibit highly localized pitting in the presence of moisture. Galvanic action of aluminum surrounding Al2Cu theta phase particles causes this localized aluminum corrosion, which in turn creates an effective barrier to high quality wire bonding (see FIG. 2b).

For optical semiconductor devices, the use of nitride films, such as plasma enhanced nitride film (PESiN), are not suitable as they are not optically compatible. Conformality is an indication of the ability of the film-deposition process to coat the surfaces of undercut recesses as well as the top and side wall surfaces. The PESiN process is often non-conformal resulting in an increased number of big voids within the film structure. These voids can affect the refractive index of the passivation layer, and hence, the optical performance of the semiconductor device.

The use of PEOX in a dual passivation process has its limitations. If PEOX is used as the first passivation layer in the dual passivation process, there can be delamination failure of the semiconductor device after the alloy process in BEOL and the assembly process stage. Further, the use of PEOX for the second layer in a dual passivation process is not desirable as PEOX is a non-conformal film, which can result in overhang, poor step coverage and voids within the film.

Therefore, in the manufacture of optical semiconductor devices oxide layers such as plasma enhanced tetraethyl orthosilicate (PETEOS) are used for both layers in the double passivation process.

However, PETEOS more readily traps moisture and particles from the environment with chemical molecules such as Cl— than other materials for passivation layers, such as PESiN or SiO2 (glass). The structure of TEOS film contains —O, —H, and —OH groups which can trap chloride (Cl—), as illustrated in FIG. 3. Depending on the process conditions in which the PETEOS based film is formed, the film can have more —O, —H or —OH bonding on the surface with moisture. These molecules have temporary bonding, like dipole-dipole interaction/Van der Waals force, resulting in molecules being trapped on the surface.

PETEOS has a high wettability as it has a low contact angle with water. In particular, PETEOS has a contact angle of 0 degrees with water. Therefore, PETEOS film surface can trap moisture, along with chloride or fluoride elements, from the environment or manufacturing processes, such as etching. The presence of these molecules on the surface of the PETEOS film can result in the formation of an acid. If this acid is in contact with the bond pad, bond pad corrosion can occur.

In an example, Cl— and moisture on the surface of the PETEOS film surface can combine to form hydrochloric acid (HCl), which corrode the bond pad.

Plasma enhanced silicon nitride (PESIN) has a contact angle of 38.04 degrees with water and as a result the levels of bond pad corrosion experienced in semiconductor devices with a nitride layer in the passivation layer is less than that experienced for devices with PETEOS only passivation layers. Hence, this corrosion problem is more common in optical semiconductor devices which utilise PETEOS in both layers of the double passivation process.

Moisture cannot be removed completely from the environment. It can only be controlled, such as through using an alloy process or N2 box. As a result, other means are needed to reduce moisture for PETEOS layers.

To address this failure mechanism, a sandwich passivation layer is provided. According to one aspect of the present disclosure, there is provided a method of forming a sandwich passivation layer on a semiconductor device comprising a bond pad, the method comprising:

forming a first layer over a surface of the semiconductor device;
removing a part of the first layer to expose a surface of the bond pad;
forming a second layer over the first layer and the bond pad; and
forming a third layer over the second layer;
wherein the surface of the bond pad is not in contact with the first layer or third layer so as to reduce corrosion of the bond pad arising from molecules trapped on a surface of the first layer or third layer.

Thus, embodiments of this disclosure provide a sandwich passivation layer which reduces corrosion of the bond pad, by ensuring that the surface of the bond pad is not in contact with the first or third layer and exposed to the molecules trapped on the surfaces of the first and third layers. The surface of the bond pad is effectively separated from the first layer and third layer. In an embodiment, the molecules include chlorine or fluorine. In an embodiment, the molecules include moisture molecules, such as OH.

In an embodiment, forming the first layer may comprise forming the first layer on an initial layer formed on the semiconductor device, and wherein removing a part of the first layer further comprises removing a part of the initial layer to expose a surface of the bond pad (404). Optionally, the initial layer may be thinner that the first layer. In an embodiment, the height (or thickness) of the initial layer may be less than 500 A. In an embodiment, the height (or thickness) of the first layer may be equal to a height (or thickness) of an aluminium (Al) top metal layer or bond pad. For example, if the Al layer has a height of 4 kA, then the first layer may have a height of 4 kA.

In an embodiment, the method may further comprise removing a part of the third layer and second layer to expose the surface of the bond pad. This allows for a metal contact to be formed with the surface of the bond pad.

In an embodiment, a wettability of the first layer and third layer may be higher than a wettability of the second layer. As a result, the trapping of molecules and moisture on the surface of the second layer is less than that of the first layer or third layer. This results in reduced corrosion of the bond pad.

Optionally, the first layer, second layer and third layer may be formed of a material, or materials, that are optically compatible for use in an optical semiconductor device. Optionally, the first layer, second layer and/or third layer may have a high conformality.

In an embodiment, the first layer and third layer are formed from plasma-enhanced TEOS (PETEOS).

In an embodiment, the second layer may be formed from plasma enhanced oxide (PEOX). PEOX has a different structure to PETEOS comprising of less —O and —OH groups. This reduces temporary bonding, like dipole-dipole interaction/Van der Waals force between Cl— and —H/—O or —OH elements on surface of the SiO2 film formed from PEOX. This prevents moisture and Cl— and F— elements being trapped on the surface and causing corrosion of the bond pad.

By providing a layer of PEOX between the first and second layer, some of the disadvantages of known passivation layers can be avoided.

The layer of PEOX may have a height below 1000 A.

PEOX has a contact angle of 52.18 degrees with water, and so has a lower wettability that the first layer and third layer.

Furthermore, PEOX is optically compatible for use in optical semiconductor devices as it is conformal.

In an embodiment, the semiconductor device may be an optical device.

In an embodiment, the third layer may have a low deposit rate. In an embodiment, the third layer can be formed at a deposit rate of 500 A/min or below. In an embodiment, the third layer can be formed at a deposit rate of 500 A/min. The lower deposit rate establishes good film density and reduces failures or effects due to stress.

In the process of forming the sandwich passivation layer the first layer, second layer and third layer of the sandwich passivation layer can be formed in the same chamber and/or with the same equipment. Such a process reduces the need for additional etching and/or masking processes.

According to a second aspect of this disclosure, there is provided a semiconductor device comprising:

a bond pad; and
a sandwich passivation layer comprising:
a first layer;
a second layer on the first layer; and
a third layer on the second layer;
wherein the surface of the bond pad is not in contact with the first layer or third layer so as to reduce corrosion of the bond pad arising from molecules trapped on a surface of the first layer or third layer.

In an embodiment, the first layer is formed on an initial layer formed on the semiconductor device, and wherein the surface of the bond pad is not in contact with the initial layer (404).

In an embodiment, the device further comprises an opening in the third layer and second layer expose the surface of the bond pad 404.

In an embodiment, a wettability of the first layer and third layer may be higher than a wettability of the second layer. As a result, the trapping of molecules and moisture on the surface of the second layer is less than that of the first layer or third layer. This results in reduced corrosion of the bond pad.

Optionally, the first layer, second layer and third layer may be formed of a material, or materials, that are optically compatible for use in an optical semiconductor device. Optionally, the first layer, second layer and/or third layer may have a high conformality.

In an embodiment, the first layer and third layer are formed from plasma-enhanced TEOS (PETEOS). This material is commonly used in optical semiconductor devices due to its conformality, and thus good optical properties.

In an embodiment, the second layer may be formed from plasma enhanced oxide (PEOX). PEOX has a different structure to PETEOS comprising of less —O and —OH groups. This reduces temporary bonding, like dipole-dipole interaction/Van der Waals force between Cl— and —H/—O or —OH elements on surface of the SiO2 film formed from PEOX. This prevents moisture and Cl— and F— elements being trapped on the surface and causing corrosion of the bond pad.

PEOX has a contact angle of 52.18 degrees with water, and so has a lower wettability that the first layer and third layer.

Furthermore, PEOX is optically compatible for use in optical semiconductor devices as it is conformal.

In an embodiment, the semiconductor device may be an optical device.

In an embodiment, the PEOX layer may have a low deposit rate. In an embodiment, the second layer can be formed at a deposit rate of 500 A/min or below. In an embodiment, the second layer can be formed at a deposit rate of 500 A/min.

The process of forming the sandwich passivation layer can be an in-situ chamber process. Thus, the formation of the sandwich passivation layer will not have an impact on any etch process.

Compared to such known methods of preventing corrosion, the present method and device for reducing aluminum bond pad corrosion in semiconductor devices disclosed here have the following advantages:
1. The method and device are effective at reducing corrosion of the bond pad due to chlorine.
2. The conformal properties of PEOX mean the sandwich passivation layer can be used in optical semiconductor devices.
3. By reducing corrosion of the bond pad and thus device failures, it improves output of BEOL.
4. In the formation of the sandwich passivation layer, the first layer, second layer and third layer are formed in the same chamber and/or with the same equipment. Optionally, the initial layer may also be formed in the same chamber or with the same equipment
5. The method and device can utilise a low deposit rate for the third layer.

Finally, the present method and semiconductor device disclosed here utilise a novel approach at least in that they provide a sandwich passivation layer for reducing corrosion of a bond pad.

BRIEF DESCRIPTION OF THE PREFERRED EMBODIMENTS

Some embodiments of the disclosure will now be described by way of example only and with reference to the accompanying drawings, in which.

DETAILED DESCRIPTION OF THE PREFERRED EMBODIMENTS

Generally speaking, the disclosure provides a sandwich, or composite, passivation layer to reduce corrosion of a bond pad in a semiconductor device. The sandwich passivation layer comprises a first layer, a third layer and a second layer between the first layer and third layer. This reduces corrosion of the bond pad arising from molecules trapped on a surface of the first layer or third layer.

Some examples of the solution are given in the accompanying figures.

Figure 1:
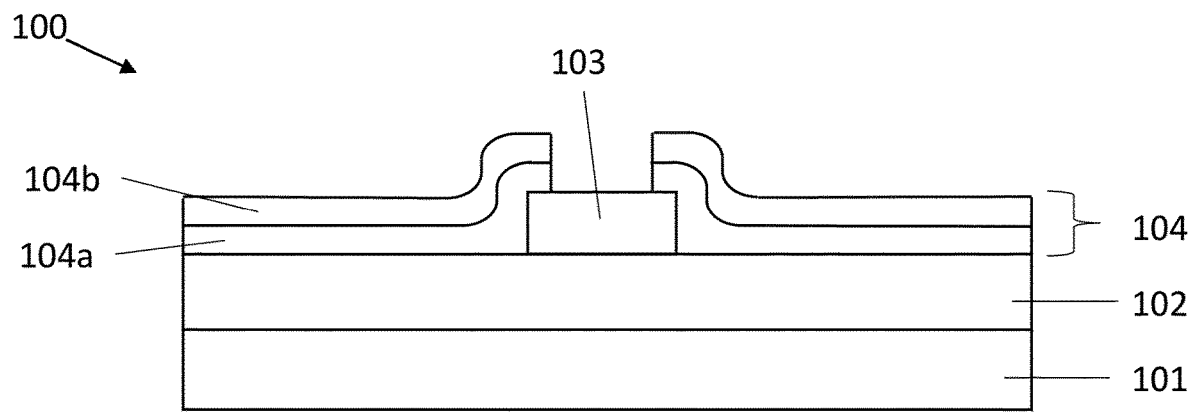
FIG. 1 illustrates a semiconductor device known in the prior art.
Figure 2A:
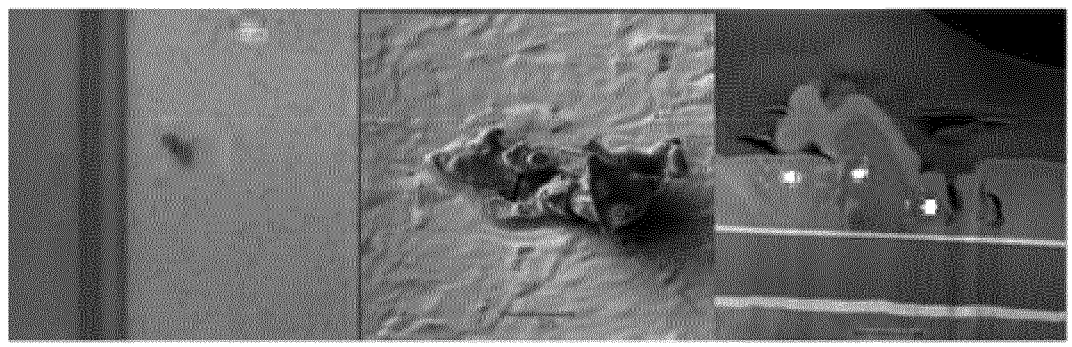
FIG. 2a illustrates pad corrosion found at the bond pad in X-ray cross section (XSEM) during failure mode analysis.
Figure 2B:
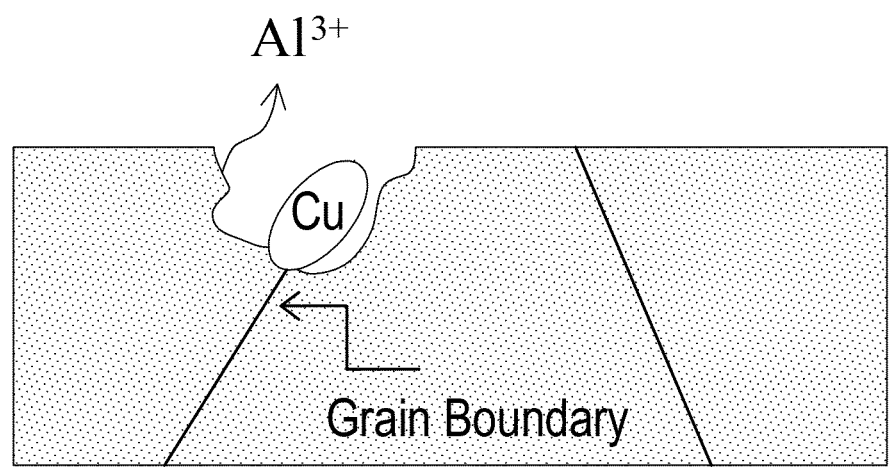
FIG. 2b illustrates a failure mechanism of aluminium bond pad corrosion.
Figure 3:
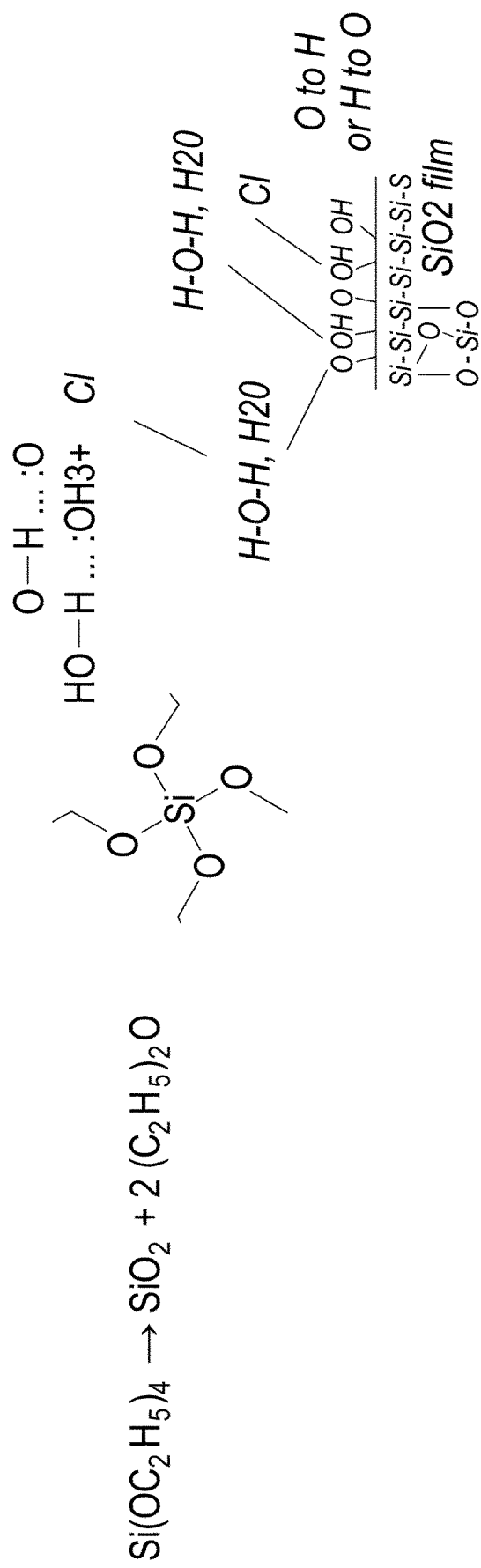
FIG. 3 illustrates contamination of a PETEOS film in a passivation layer.
Figure 4A:
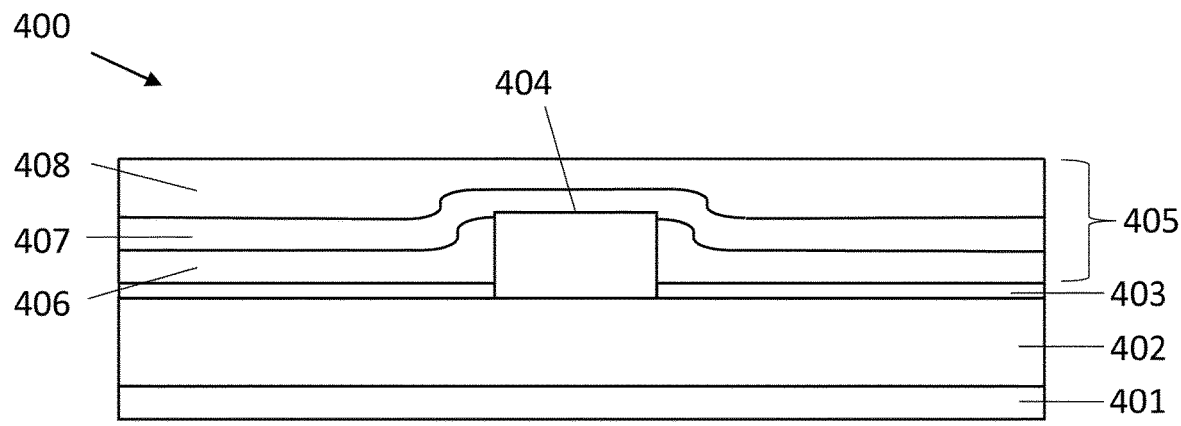
FIG. 4a shows a semiconductor device in accordance with the present disclosure.

FIG. 4a shows a semiconductor device 400 in accordance with an embodiment of the invention. The semiconductor device 400 comprises a semiconductor substrate 401 on which are formed device layers 402 that provide device structure. In an embodiment, the device structure is an optical structure. For example, the device structure may be a light emitting diode or a photodiode. The device layers 402 further comprise any interconnect layer required to enable connection to parts of the device structure.

An initial layer 403 is formed over the device layers 402. The initial layer 403 may be a top dielectric layer. In an embodiment the initial layer is formed from PETEOS.

The bond pad 404 may be made of an aluminium-copper (Al—Cu) composite. A surface of the bond pad 404 defines an area on the surface of the top metal layer for forming a metal bond to, for example, a wire, contact, device, or circuit board.

A sandwich passivation layer 405 is formed over the initial layer. The sandwich passivation layer 405 comprises a first layer 406, a second layer 407 over the first layer 406 and the surface of the bond pad 404, and a third layer 408 over the second layer 407. As can be seen from FIG. 4a the surface of the bond pad 404 is not in contact with the first layer 406 or third layer 407.

Figure 5:
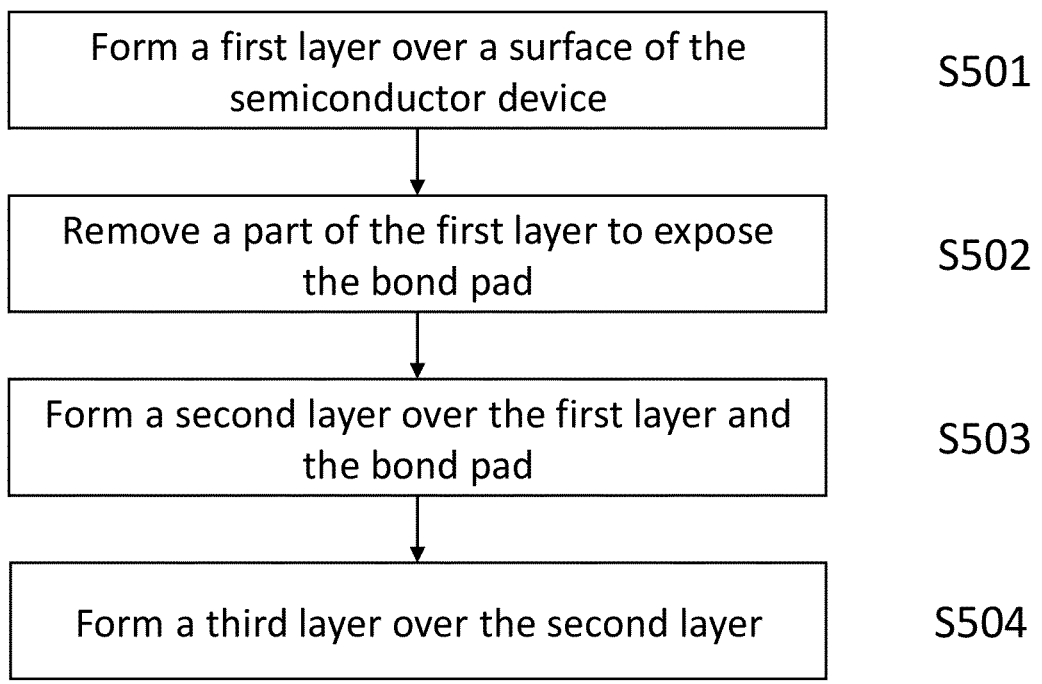
FIG. 5 illustrates a method in accordance with the present disclosure.

Referring to both FIG. 4a and FIG. 5 the method for creating the sandwich passivation layer is detailed below.

In step S501, a first layer 406 is formed over the initial layer 403, covering the bond pad 404. The first layer 406 is formed using a CVD process or a PECVD process. The deposit ratio (A/min) for the first layer 406 will depend on the thickness of the metal layer 404. In an embodiment, the deposit ratio is in the range 2000~8000 A/min. In an embodiment, the first layer 406 is formed from PETEOS.

In step S502, a part of the first layer 406 is removed to form an opening over the bond pad 404. In an embodiment, this is achieved by an etching process. However, it would be apparent to the person skilled in the art that other techniques could be utilised, for example, chemical mechanical polishing (CMP).

In step S503, a second layer 407 is formed over the first layer 406 and the surface of the bond pad 404. The second layer 407 is formed using a CVD process or a PECVD process. The deposit ratio (A/min) for the second layer may be below 500 A/min. In an embodiment, the second layer 407 has a wettability less than the first layer 406. In an embodiment, the second layer 407 is formed from PEOX.

In step S504, a third layer 408 is formed on the second layer 407. The third layer is formed using a CVD process or a PECVD process. In an embodiment, the second layer 407 has a wettability less than the third layer 408. In an embodiment, the third layer 408 is formed from PETEOS.

Figure 6:
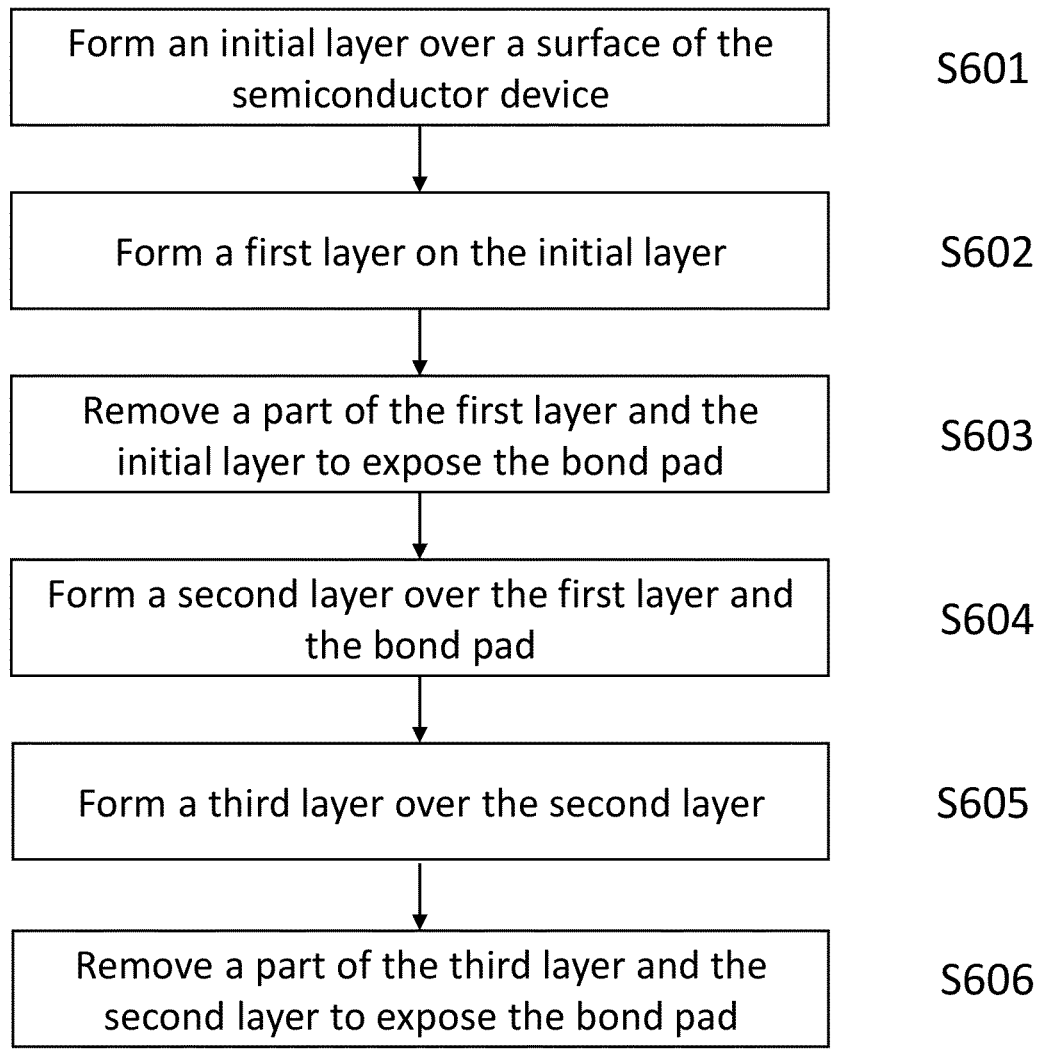
FIG. 6 illustrates a method in accordance with the present disclosure.

Referring to FIG. 6, in an embodiment the method may comprise additional steps. Optionally, the initial layer 403 may be formed on the semiconductor device 400 prior to the formation of the first layer 406 (S601). Consequently in S602, the first layer 406 is formed on the initial layer 403 and in S603 part of the first layer 406 and the initial layer 403 are removed to expose the bond pad 404.

Steps S604 and S605 are equivalent to S503 and S504 described above.

Figure 4B:
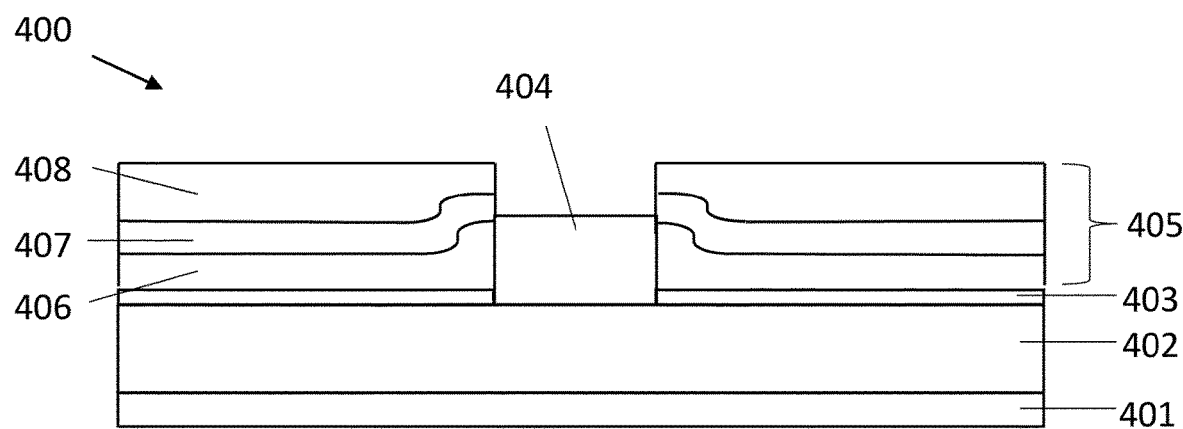
FIG. 4b shows a semiconductor device in accordance with the present disclosure.

In step S606, a part of the third layer 408 and second layer 407 are removed to form an opening over the bond pad 404 and expose the surface of the bond pad 404, as illustrated in FIG. 4b. In an embodiment, this is achieved by an etching process. However, it would be apparent to the person skilled in the art that other techniques could be utilised, for example, chemical mechanical polishing (CMP).

Figure 4C:
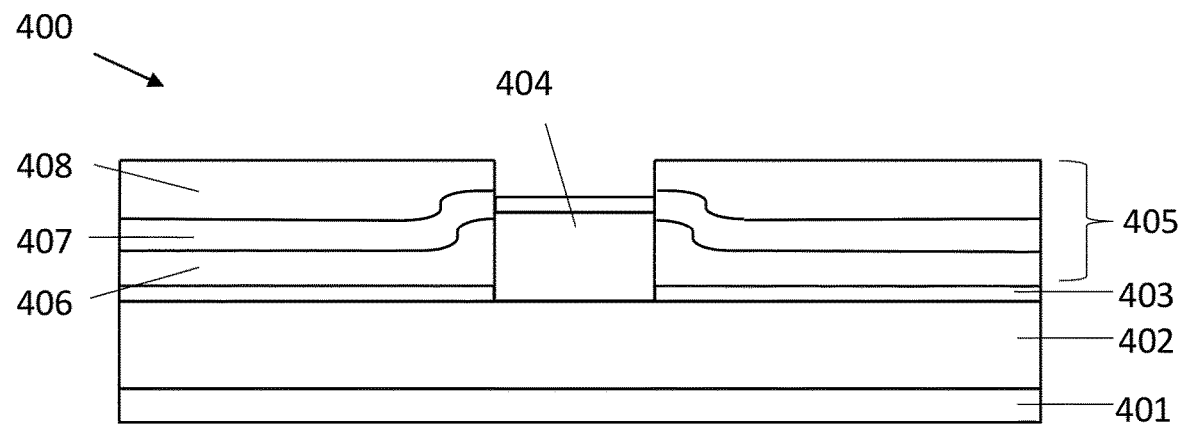
FIG. 4c shows a semiconductor device in accordance with the present disclosure.
Figure 4D:
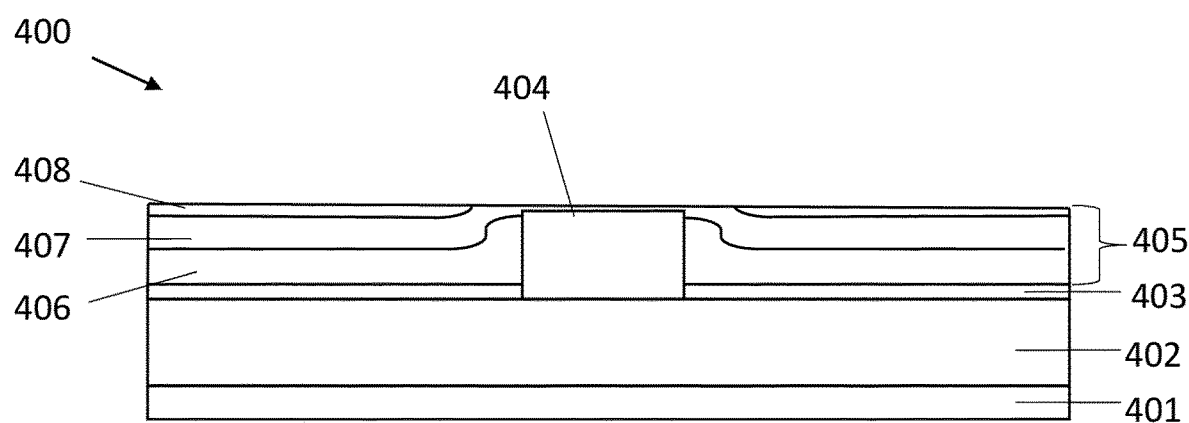
FIG. 4d shows a semiconductor device in accordance with the present disclosure.

Alternatively, the sandwich passivation layer 405 may then be etched or subjected to CMP so that a much thinner second layer 407 remains on the surface of the bond pad 404, as illustrated in FIG. 4c and FIG. 4d. This thinner second layer 407 would protect the surface of the bond pad 404 until it is needed for metal contacting. An additional removing step would be required to remove the thinner second layer 407 before the metal contact on the surface of the bond pad 404 can be formed.

Embodiments of the present disclosure can be employed in many different semiconductor manufacture applications including optical devices, for example, in the optical device industry and other industries.

LIST OF REFERENCE NUMERALS

100 a semiconductor device
101 a semiconductor substrate
102 a top dielectric layer
103 a bond pad
104 a passivation layer
104a silicon oxide
104b silicon nitride
400 a semiconductor device
401 a semiconductor substrate
402 device layers
403 an initial layer
404 a bond pad
405 a sandwich passivation layer
406 a first layer
407 a second layer
408 a third layer The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. A method of forming a sandwich passivation layer on a semiconductor device comprising a bond pad, the method comprising:
    forming a first layer over a surface of the semiconductor device and over a top surface of the bond pad;
    removing a part of the first layer to expose the top surface of the bond pad;
    forming a second layer over the first layer and the top surface of the bond pad; and
    forming a third layer over the second layer;
    wherein the top surface of the bond pad is not in contact with the first layer or third layer, and wherein a wettability of the first layer and third layer is higher than a wettability of the second layer.

2. The method according to claim 1 wherein forming the first layer comprises forming the first layer on an initial layer formed on the semiconductor device, wherein removing the part of the first layer further comprises removing a part of the initial layer to expose the top surface of the bond pad, and wherein the top surface of the bond pad is not in contact with the initial layer.

3. The method according to claim 1 further comprising removing a part of the third layer and second layer to expose the top surface of the bond pad.

4. The method according to claim 1 wherein the first layer and third layer are formed from plasma-enhanced TEOS (PETEOS).

5. The method according to claim 1 wherein the second layer is formed from plasma enhanced oxide (PEOX).

6. The method according to claim 1 wherein the semiconductor device is an optical device.

7. The method according to claim 1 wherein the third layer is formed at a deposit rate of 500 A/min or below.

8. The method according to claim 1 wherein the first layer, the second layer, and the third layer are formed using same equipment.

9. A semiconductor device comprising:
    a bond pad; and
    a sandwich passivation layer comprising:
    a first layer on a surface of the semiconductor device, wherein the first layer is formed on an initial layer formed on the semiconductor device;
    a second layer on the first layer and on a top surface of the bond pad; and
    a third layer on the second layer;
    wherein the top surface of the bond pad is not in contact with the initial layer, first layer, or third layer, and wherein a wettability of the first layer and third layer is higher than a wettability of the second layer.

10. The semiconductor device according to claim 9 wherein the first layer and third layer are formed from plasma-enhanced TEOS (PETEOS).

11. The semiconductor device according to claim 9 wherein the second layer is formed from plasma enhanced oxide (PEOX).

12. The semiconductor device according to claim 9 wherein the semiconductor device is an optical device.

13. The semiconductor device according to claim 9 wherein the third layer is formed at a deposit rate of 500 A/min or below.

14. The semiconductor device according to claim 9 wherein the first layer, the second layer, and the third layer are formed using same equipment.

\* \* \* \* \*